(12) United States Patent
Yun et al.

(10) Patent No.: US 10,168,725 B2
(45) Date of Patent: Jan. 1, 2019

(54) CURRENT CLAMP CIRCUIT

(71) Applicant: NXP B.V., Eindhoven (NL)

(72) Inventors: Tinghua Yun, Shanghai (CN); Xindong Duan, Shanghai (CN); Mingliang Wan, Shanghai (CN)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/679,024

(22) Filed: Aug. 16, 2017

(65) Prior Publication Data
US 2018/0136685 A1 May 17, 2018

(30) Foreign Application Priority Data
Nov. 14, 2016 (CN) .......................... 2016 1 1001611

(51) Int. Cl.
*G01R 27/02* (2006.01)
*G05F 3/26* (2006.01)
*G01R 19/00* (2006.01)
*H02M 3/158* (2006.01)

(52) U.S. Cl.
CPC ......... *G05F 3/262* (2013.01); *G01R 19/0092* (2013.01); *G01R 27/02* (2013.01); *H02M 3/1588* (2013.01)

(58) Field of Classification Search
CPC .... G01R 19/00; G01R 19/0092; G01R 27/00; G01R 27/02; G05F 1/00; G05F 1/465; G05F 3/00; G05F 3/24; G05F 3/247; G05F 3/262; G11C 5/00; G11C 5/147; H02M 3/00; H02M 3/1588
USPC .......................................................... 327/541
See application file for complete search history.

(56) References Cited

U.S. PATENT DOCUMENTS

| | | | |
|---|---|---|---|
| 6,600,362 B1 | 7/2003 | Gavrila | |
| 6,801,030 B2 | 10/2004 | Tai et al. | |
| 8,779,777 B2 | 10/2014 | Irmer et al. | |
| 2011/0298473 A1* | 12/2011 | Irmer | G01R 19/0092 324/601 |
| 2017/0295632 A1* | 10/2017 | Sun | H05B 37/02 |
| 2018/0123578 A1* | 5/2018 | Chauhan | G01R 19/0092 |

* cited by examiner

Primary Examiner — Lincoln Donovan
Assistant Examiner — David Mattison
(74) Attorney, Agent, or Firm — Charles E. Bergere (57) ABSTRACT

A current clamp circuit includes a current-source circuit, a current-sense circuit, and a feedback circuit. The current-sense circuit includes a transistor, a resistive network, and a multiplexer. The transistor outputs a sensed current signal having a current that is equal to a current of an output signal provided by the current-source circuit. The feedback circuit limits the current of the sensed current signal and the output signal below a threshold current. The multiplexer modifies a resistance of the resistive network based on a first control signal. The multiplexer circuit and the feedback circuit are programmed using the first control signal and a second control signal when the transistor operates in a linear region and in a saturation region, respectively, to accurately output the sensed current signal.

11 Claims, 3 Drawing Sheets

CURRENT CLAMP CIRCUIT

BACKGROUND

The present invention relates generally to integrated circuits, and more particularly, to a current clamp circuit for over current protection.

Many integrated circuits (IC) include a current-source circuit that receives an input signal and provides an output signal to a load circuit based on the input signal. Typically, a metal-oxide semiconductor field effect transistor (MOSFET) is used as a current-source circuit. Fluctuations in the input signal can cause the current of the output signal to fluctuate, and sometimes the fluctuations may cause the input signal to increase beyond a threshold current level, which may result in an over-heating of the load circuit, which could damage the load circuit. Hence, a current clamp circuit may be provided to prevent an increase of the current of the output signal and thus, protect the load circuit.

A conventional current clamp circuit includes a current-source circuit, a current-sense circuit, and a feedback circuit. The current-source circuit is connected to the load circuit and includes a first MOSFET. The current-sense circuit includes a second MOSFET and an operational amplifier (op-amp) in a negative-feedback configuration. Each of the first and second MOSFETs has a drain and a gate that receive the input signal and a bias signal, respectively. A source of the first MOSFET provides the output signal to the load circuit. The source of the second MOSFET provides a sensed current signal. The op-amp is connected to the sources of the first and second MOSFETs to receive the output signal and the sensed current signal, respectively. The op-amp ensures that a voltage level of the sensed current signal is equal to a voltage level of the output signal. Hence, gate-to-source and drain-to-source voltages of the first MOSFET are approximately equal to gate-to-source and drain-to-source voltages of the second MOSFET, respectively. Since the current output from a MOSFET is based on the gate-to-source and drain-to-source voltages, the current of the sensed current signal is approximately equal to the current of the output signal.

The feedback circuit is connected to the current-source and current-sense circuits and generates the bias signal based on the sensed current signal. The bias signal controls a voltage level at the gates the first and second MOSFETS. Thus, when the current of the sensed current signal (which is equal to the current of the output signal) is equal to the threshold current, the feedback circuit reduces the voltage level of the bias signal to limit the current of the output signal.

The first and second MOSFETs may include first and second parasitic resistors having resistances that are not equal to each other, so a voltage drop across the first parasitic resistor will not be equal to a voltage drop across the second parasitic resistor. Thus, the drain-to-source voltage of the first MOSFET will not be equal to the drain-to-source voltage of the second MOSFET. Hence, the current of the sensed current signal will not be equal to the current of the output signal. Thus, the current-sense circuit does not accurately sense the current of the output signal and hence, the bias signal output by the feedback circuit may have a voltage level that fails to limit the current of the output signal below the threshold current. Further, since the resistances of the first and second parasitic resistors are small, i.e., in the range of a few milliohms, they are difficult to measure and rectify.

A known technique to ensure equal voltage drops across the first and second parasitic resistors is to connect a compensation resistor between the source of the second MOSFET and the op-amp. A voltage drop across the compensation resistor and the second parasitic resistor is approximately equal to the voltage drop across the first parasitic resistor. However, the resistance of the first and second parasitic resistors may change due to package stress and process-voltage-temperature (PVT) variations, whereas the resistance of the compensation resistor is fixed. Hence, the PVT variations and package stress account for unequal drain-to-source voltages of the first and second MOSFETs. Thus, the current-sense circuit may not accurately sense the current of the output signal despite the use of the compensation resistor.

It would be advantageous to have a current clamp circuit that accurately compensates for a parasitic resistance of a current source circuit and accurately senses a current of the output signal of a current-source circuit thereof.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a current clamp circuit that includes a current-source circuit, a current-sense circuit, and a feedback circuit. The current-source circuit receives an input signal and a bias signal and outputs an output signal. A current of the output signal is controlled by the bias signal. The current-sense circuit is connected to the current-source circuit and receives the input and output signals, a first control signal, and the bias signal. The current-sense circuit outputs a sensed current signal based on the first control signal and the bias signal. A current of the sensed current signal is equal to a current of the output signal. The feedback circuit is connected to the current-sense circuit and receives the sensed current signal, a second control signal, and a reference voltage signal. The feedback circuit outputs the bias signal based on the second control signal, the reference voltage signal, and the sensed current signal.

In another embodiment, the present invention provides a current clamp circuit including a current-source circuit, a current-sense circuit, and a feedback circuit. The current-source circuit receives an input signal and a bias signal and outputs an output signal. A current of the output signal is controlled by the bias signal. The current-sense circuit is connected to the current-source circuit and receives the input and output signals, a first control signal, and the bias signal. The current-sense circuit outputs a sensed current signal based on the first control signal and the bias signal. A current of the sensed current signal is equal to a current of the output signal. The current-sense circuit includes a first transistor, a first resistive network, a multiplexer-circuit, and a first operational amplifier. The first transistor has a drain for receiving the input signal, a gate for receiving the bias signal, and a source for outputting an intermediate signal. A current of the intermediate signal is equal to the current of the sensed current signal. The first resistive network is connected to the source of the first transistor and receives the intermediate signal. The first resistive network includes a set of resistors connected in series with each other. The multiplexer circuit is connected to the first resistive network and receives the first control signal. The multiplexer circuit modifies a resistance of the first resistive network based on the first control signal and outputs a sensed voltage signal based on a modified resistance of the first resistive network and the intermediate signal. The first control signal includes a set of bits corresponding to the set of resistors of the first resistive network. The first operational amplifier has first and second input terminals connected to the current-source circuit and the multiplexer circuit for receiving the output signal and the sensed voltage signal, respectively. The first operational amplifier further has an output terminal connected to the first resistive network. The feedback circuit is connected to the output terminal of the first operational amplifier and receives the sensed current signal, a second control signal, and a reference voltage signal. The feedback circuit outputs the bias signal based on the second control signal, the reference voltage signal, and the sensed current signal.

Various embodiments of the present invention provide a current clamp circuit that is connected to a load circuit and that includes a current-source circuit, a current-sense circuit, and a feedback circuit. The current-source circuit receives an input signal and a bias signal and outputs an output signal. The current-sense circuit receives the input signal, the bias signal, the output signal, and a first control signal. The current-sense circuit includes a first transistor, a resistive network, a multiplexer circuit, and an operational amplifier. When the transistor operates in a linear region, the multiplexer circuit modifies a resistance of the resistive network based on the first control signal so that the transistor outputs a sensed current signal that has a current equal to a current of the output signal. The feedback circuit limits the currents of the sensed current signal and the output signal below the threshold current. Further, when the transistor operates in a saturation region, the feedback circuit receives a second control signal so that the transistor accurately outputs the sensed current signal.

Thus, the first and second control signals are provided to the current clamp circuit to modify resistances of the resistive network and the feedback circuit. Voltage drops across modified resistances of the resistive network and the feedback circuit compensate for a voltage drop due to a parasitic resistance of the current-source circuit. Thus, the current clamp circuit accurately senses the current of the output signal and prevents inaccuracies in sensing the current of the output signal due to the parasitic resistance of the current source circuit. Further, the current clamp circuit limits the current to a threshold current, thereby preventing damage to the load circuit.

Figure 1:
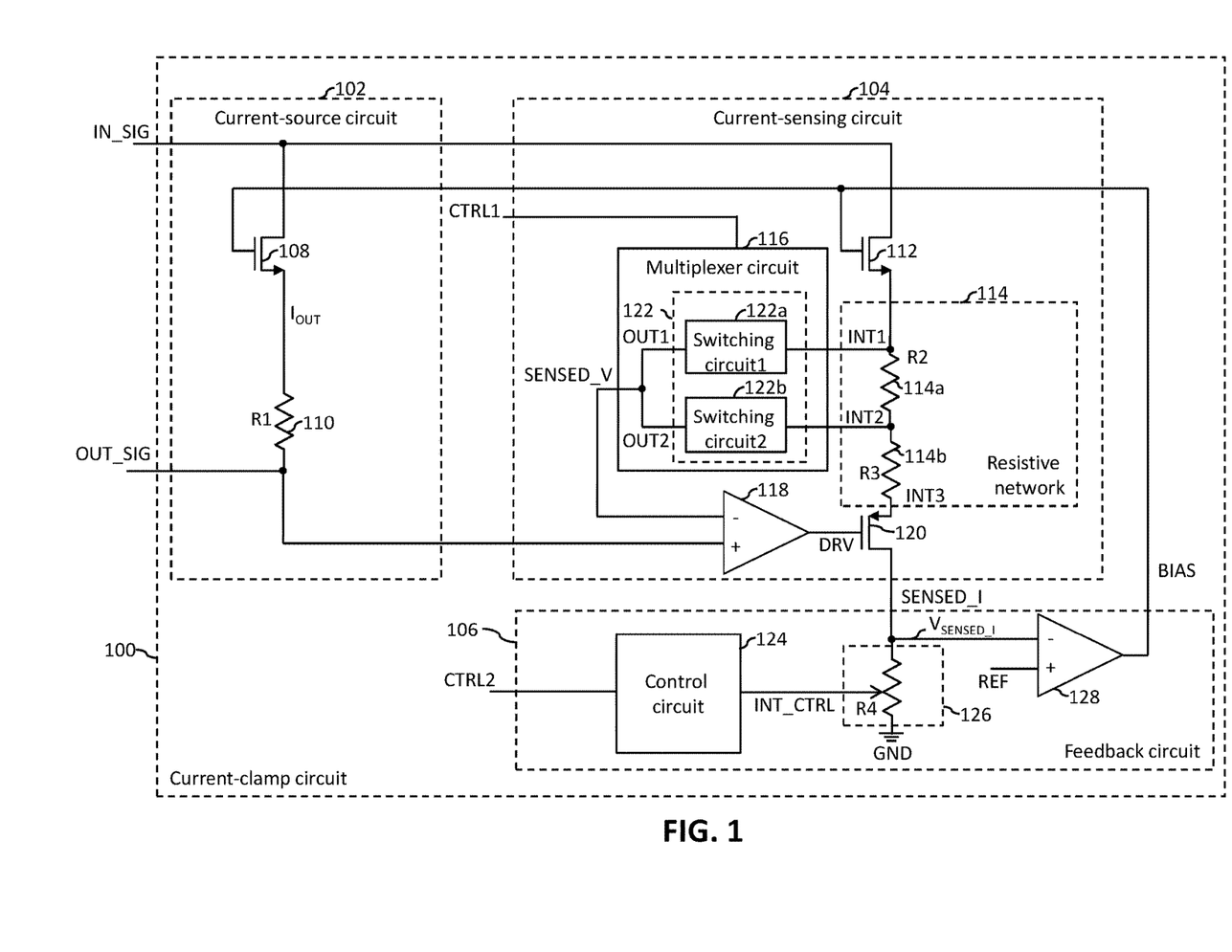
FIG. 1 is a schematic circuit diagram of a current clamp circuit in accordance with an embodiment of the present invention.

Referring now to FIG. 1, a schematic circuit diagram of a current clamp circuit 100 in accordance with an embodiment of the present invention is shown. The current clamp circuit 100 includes a current-source circuit 102, a current-sense circuit 104, and a feedback circuit 106. The current-source circuit 102 is connected to an external circuit (not shown) for receiving an input signal IN_SIG and a load circuit (not shown). The current-source circuit 102 outputs an output signal OUT_SIG to the load circuit based on a bias signal BIAS and the input signal IN_SIG. The current-sense circuit 104 is connected to the current-source circuit 102 to sense the output signal OUT_SIG and output a sensed current signal SENSED_I that has a current equal to a current of the output signal OUT_SIG. The feedback circuit 106 is connected to the current-sense circuit 104 and the current-source circuit 102 and generates the bias signal BIAS based on the sensed current signal SENSED_I. The feedback circuit 106 controls a voltage level of the bias signal BIAS in order to prevent an increase in the current of the output signal OUT_SIG beyond a threshold current. The threshold current is a current that causes the load circuit to over-heat and damages it.

The current-source circuit 102 includes a first transistor 108 and a first resistor 110. The current-sense circuit 104 includes a second transistor 112, a first resistive network 114, a multiplexer circuit 116, a first operational amplifier (op-amp) 118, and a third transistor 120. The first resistive network 114 includes multiple resistors—two of which are shown—second and third resistors 114a and 114b. The multiplexer circuit 116 includes a set of switching circuits 122. The set of switching circuits 122 includes first and second switching circuits 122a and 122b. The feedback circuit 106 includes a control circuit 124, a second resistive network 126, and a second op-amp 128. In the presently preferred embodiment, the first and second transistors 108 and 112 are N-channel metal-oxide semiconductor field-effect transistors (NMOS) and the third transistor 120 is a P-channel metal-oxide semiconductor field-effect transistor (PMOS).

The first transistor 108 has a drain that receives the input signal IN_SIG and a gate that receives the bias signal BIAS. The first transistor 108 has a source that outputs the output signal OUT_SIG at an intermediate voltage level. The first resistor 110 is connected to the source of the first transistor 108 and outputs the output signal OUT_SIG at an output voltage level. The difference between the voltage levels of the gate and source of the first transistor 108 is referred to as 'gate-to-source voltage ($V_{GS\_FIRST}$) of the first transistor 108'. The difference between the voltage levels of the drain and source of the first transistor 108 is referred to as 'drain-to-source voltage ($V_{DS\_FIRST}$) of the first transistor 108'. It is well-known to a person skilled in the art that the current of the output signal OUT_SIG is based on the gate-to-source voltage ($V_{GS\_FIRST}$) of the first transistor 108 and the drain-to-source voltage ($V_{DS\_FIRST}$) of the first transistor 108.

The second transistor 112 has a drain that receives the input signal IN_SIG and a gate that receives the bias signal BIAS. The second transistor 112 has a source that outputs a first intermediate signal INT1. The difference between the voltage levels of the gate and source of the second transistor 112 is referred to as 'gate-to-source voltage ($V_{GS\_SECOND}$) of the second transistor 112'. The difference between the voltage levels of the drain and source of the second transistor 112 is referred to as 'drain-to-source voltage ($V_{DS\_SECOND}$) of the second transistor 112'. It is well-known to a person skilled in the art that a current of the first intermediate signal INT1 is based on the gate-to-source voltage ($V_{GS\_SECOND}$) of the second transistor 112 and the drain-to-source voltage ($V_{DS\_SECOND}$) of the second transistor 112.

It will be understood by those of skill in the art that each of the first and second transistors 108 and 112 includes a parasitic resistance across the corresponding drain and source of each of the first and second transistors 108 and 112. In the presently preferred embodiment, the parasitic resistance of the first transistor 108 is represented using the first resistor 110. A resistance of the first resistor 110 is in a range of a few milliohms. Hence, it is difficult to measure these resistances using the well-known resistance measurement techniques. Further, the second and third resistors 114a and 114b are external discrete components and do not represent the parasitic capacitance the second transistor 112.

The second resistor 114a has a first terminal that is connected to the source of the second transistor 112 to receive the first intermediate signal INT1. The second resistor 114a has a second terminal to output a second intermediate signal INT2. The third resistor 114b has a first terminal connected to the second terminal of the second resistor 114a to receive the second intermediate signal INT2. The third resistor 114b has a second terminal to output the sensed current signal SENSED_I. The first terminal of the second resistor 114a and the second terminal of the third resistor 114b are connected to each other, connecting the second and third resistors 114a and 114b in series to form the first resistive network 114.

The first switching circuit 122a is connected between the first terminal of the second resistor 114a and an output terminal of the multiplexer circuit 116. The second switching circuit 122b is connected between the first terminal of the third resistor 114b and the output terminal of the multiplexer circuit 116. The first and second switching circuits 122a and 122b receive the first and second intermediate signals INT1 and INT2, respectively. The multiplexer circuit 116 further receives a first control signal CTRL1 that includes a set of bits corresponding to the set of resistors in the first resistive network 114. In the presently preferred embodiment, a number of switching circuits in the set of switching circuits 122 is equal to a number of resistors in the first resistive network 114. Further, a number of bits in the set of bits of the first control signal CTRL1 is equal to a number of resistors in the first resistive network 114. The first switching circuit 122a receives a first bit of the first control signal CTRL1_BIT1. The first switching circuit 122a connects the first terminal of the second resistor 114a to an output terminal of the multiplexer circuit 116 based on a value of the first bit of the first control signal CTRL1_BIT1. Thus, the first switching circuit 122a outputs the first intermediate signal INT1 as a first intermediate output signal OUT1 based on the value of the first bit of the first control signal CTRL1_BIT1. The second switching circuit 122b is structurally and functionally similar to the first switching circuit 122a and outputs the second intermediate signal INT2 as a second intermediate output signal OUT2. The first switching circuit 122a will be explained in conjunction with FIG. 2. The multiplexer circuit 116 outputs the first intermediate output signal OUT1 and the second intermediate output signal OUT2 together as a sensed voltage signal SENSED_V.

The first op-amp 118 has first and second input terminals that are connected to the output terminal of the multiplexer circuit 116 and the first resistor 110, respectively. In the presently preferred embodiment, the first and second input terminals of the first op-amp 118 are inverting and non-inverting terminals, respectively. The inverting and non-inverting terminals of the first op-amp 118 are known to a person skilled in the art. The first op-amp 118 outputs a drive signal DRV at an output terminal thereof. The third transistor 120 has a gate connected to the output terminal of the first op-amp 118 to receive the drive signal DRV and a source connected to the second terminal of the third resistor 114b. The third transistor 120 has a drain that outputs the sensed current signal SENSED_I. Thus, the output terminal of the first op-amp 118 is connected to its inverting terminal by way of the gate and source of the third transistor 120 and the multiplexer circuit 116. Voltage levels at the output and inverting terminals of the first op-amp 118 are approximately equal. Hence, the first op-amp 118 has a negative-feedback configuration. The functioning of an op-amp in the negative-feedback configuration is well-known to a person skilled in the art. Further, it is known in the art that the voltage levels at the first and second input terminals of the first op-amp 118 are equal, when the first op-amp 118 is connected in the negative-feedback configuration. Hence, the first op-amp 118 outputs the drive signal DRV so that the third transistor 120 operates in a saturation region.

The control circuit 124 receives a second control signal CTRL2 and generates an intermediate control signal INT_CTRL. The second resistive network 126 has a first terminal connected to the drain of the third transistor 120 to receive the sensed current signal SENSED_I and a second terminal connected to ground GND. A voltage level at the first terminal of the second resistive network 126 is referred to as '$V_{SENSED\_I}$'. Further, the second resistive network 126 has a third terminal connected to the control circuit 124 for receiving the intermediate control signal INT_CTRL. In one embodiment, the control circuit 124 is a digital-to-analog converter (DAC). Thus, the second control signal CTRL2 is a digital signal and the intermediate control signal INT_CTRL is an analog signal. Further, the second resistive network 126 is a fourth resistor, which is a variable resistor. The control circuit 124 controls a resistance of the second resistive network 126 based on the second control signal CTRL2. In another embodiment, the control circuit 124 and the second resistive network 126 together operate as a digital potentiometer.

The second op-amp 128 has a first input terminal connected to the first terminal of the second resistive network 126 and a second input terminal for receiving a reference voltage signal REF. In the presently preferred embodiment, the first and second input terminals of the second operational amplifier 128 are inverting and non-inverting terminals, respectively. Further, a voltage level of the reference voltage signal REF is based on a product of the resistance of the second resistive network 126 and the threshold current. The second op-amp 128 outputs the bias signal BIAS at an output terminal thereof.

Figure 2:
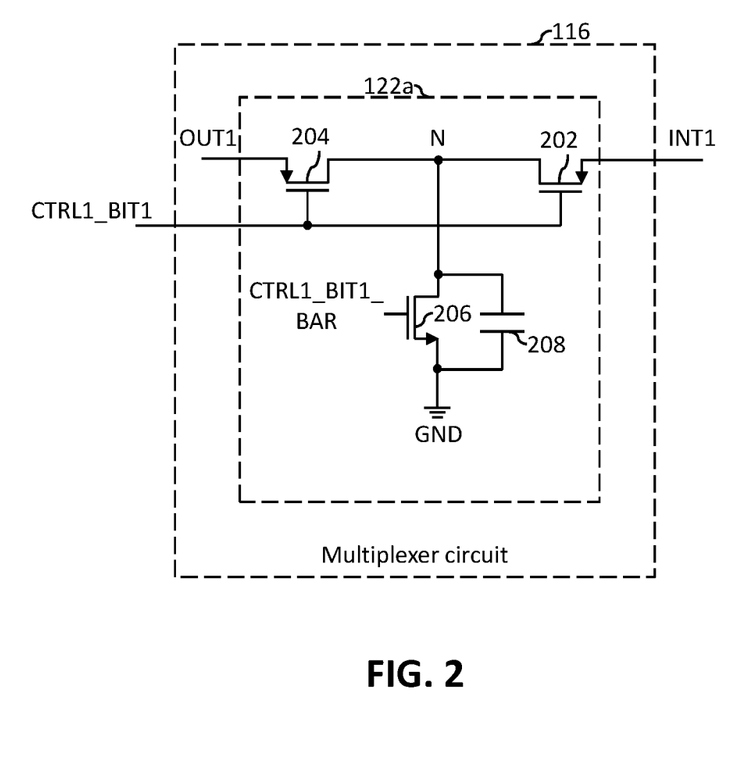
FIG. 2 is a schematic circuit diagram of a switching circuit of the current clamp circuit of FIG. 1 in accordance with an embodiment of the present invention.

Referring now to FIG. 2, a schematic circuit diagram of the first switching circuit 122a in accordance with an embodiment of the present invention is shown. The first switching circuit 122a includes fourth through sixth transistors 202-206 and a capacitor 208. In the presently preferred embodiment, the fourth and fifth transistors 202 and 204 are PMOS and the sixth transistor 206 is an NMOS.

The fourth transistor 202 has a source connected to the first terminal of the second resistor 114a and a gate that receives the first bit of the first control signal CRTL1_BIT1. The sixth transistor 206 has a drain connected to a drain of the fourth transistor 202 and a source connected to ground. The sixth transistor 206 has a gate that receives an inverted version of the first bit of the first control signal CRTL1_BIT1_BAR. The drains of the fourth through sixth transistors 202-206 are connected to form a node N. The capacitor 208 is connected across the drain and source of the sixth transistor 206. The fifth transistor 204 has a drain connected to the drain of the fourth transistor 202 and a gate that receives the first bit of the first control signal CRTL1_BIT1. The fifth transistor 204 has a source that outputs the first intermediate output signal OUT1.

In operation, the first transistor 108 receives the input signal IN_SIG and the bias signal BIAS and outputs the output signal OUT_SIG by way of the first resistor 110. The second transistor 112 receives the input signal IN_SIG and the bias signal BIAS and outputs the first intermediate signal INT1. In one embodiment, the first control signal CTRL1 includes first and second bits corresponding to the second and third resistors 114a and 114b and corresponding to the first and second switching circuits 122a and 122b. When the first bit is equal to the binary number 1'b, the fourth through sixth transistors 202-206 operate in the cut-off region. When the first bit is equal to the binary number 0'b, the fourth through sixth transistors 202-206 operate in the saturation region and connect the first terminal of the second resistor 114a to the output terminal of the multiplexer circuit 116. Thus, the multiplexer circuit 116 selects at least one resistor of the resistive network 114 based on the set of bits of the first control signal CTRL1. Thus, the multiplexer circuit 116 modifies a resistance of the resistive network 114 and outputs the sensed voltage signal SENSED_V. The first op-amp 118 receives the sensed voltage signal SENSED_V and the output signal OUT_SIG at the inverting and non-inverting terminals, respectively. Since the first op-amp 118 is in the negative-feedback configuration, voltage levels of the sensed voltage signal SENSED_V and the output signal OUT_SIG are equal. The gate of the third transistor 120 is connected to the output terminal of the first op-amp 118 and operates in the saturation region. The third transistor 120 receives the sensed current signal SENSED_I at the source and outputs it at the drain thereof. The control circuit 124 modifies the resistance of the fourth resistor 126 based on the second control signal CTRL2. The fourth resistor 126 receives the sensed current signal SENSED_I, which causes a voltage drop across the fourth resistor 126. Thus, the voltage drop across the fourth resistor 126, i.e., a voltage level of the sensed current signal SENSED_I, is proportional to a current of the sensed current signal SENSED_I. The second op-amp 128 receives the sensed current signal SENSED_I and the reference voltage signal REF at the inverting and non-inverting terminals thereof. The second op-amp 128 outputs the bias signal BIAS based on a difference between the voltage levels of the sensed current signal SENSED_I and the reference voltage signal REF. The bias signal BIAS is in a first logic state when the voltage level ($V_{SENSED\_I}$) of the sensed current signal SENSED_I is less than a voltage level of the reference voltage signal ($V_{REF}$). The bias signal BIAS is in a second logic state when the voltage level ($V_{SENSED\_I}$) of the sensed current signal SENSED_I exceeds the voltage level ($V_{REF}$) of the reference voltage signal REF. Hence, when the current of the sensed current signal SENSED_I increases beyond the threshold current, the bias signal BIAS is in the second logic state, decreasing the gate-to-source voltages ($V_{GS\_FIRST}$ and $V_{GS\_SECOND}$) of the first and second transistors 108 and 112. Thus, the feedback circuit 106 limits the currents of the sensed current signal SENSED_I and the output signal OUT_SIG.

Figure 3:
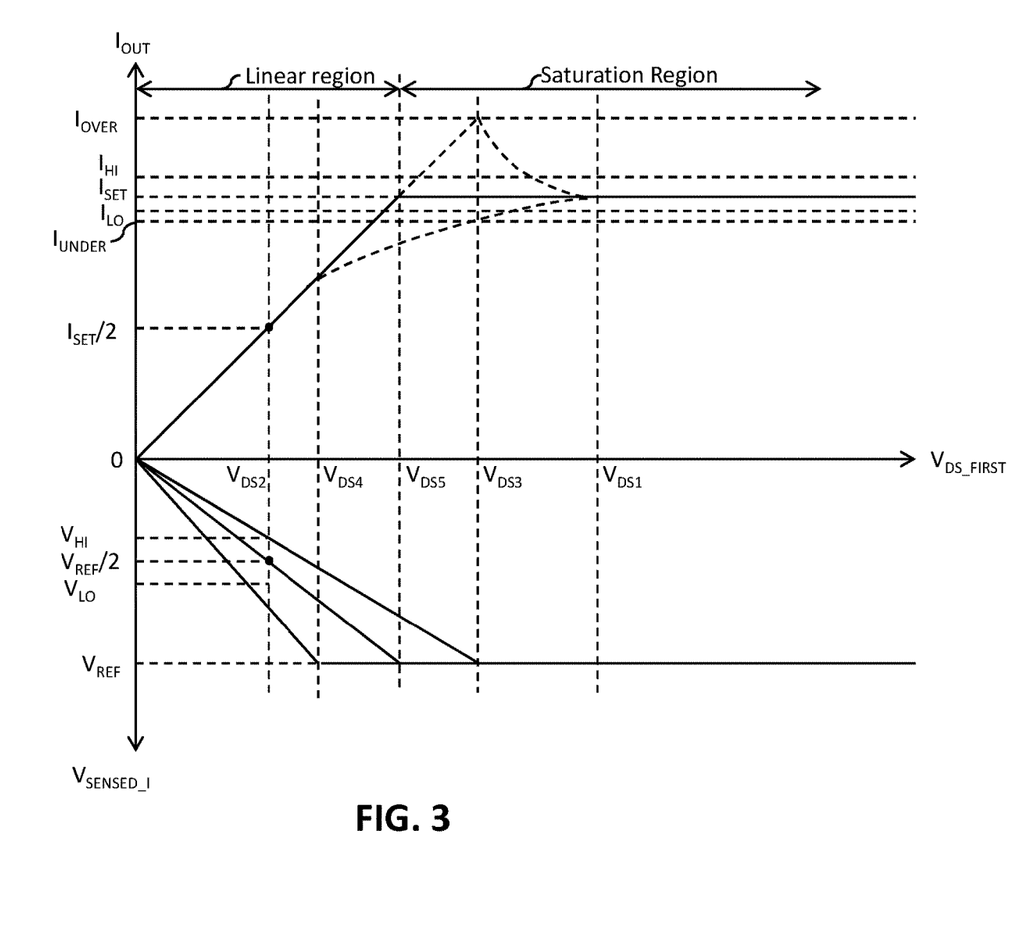
FIG. 3 is a graph illustrating a current ($I_{OUT}$) of an output signal and a sensed voltage ($V_{SENSE}$) versus the drain-to-source voltage ($V_{DS\_FIRST}$) of a first transistor of FIG. 1 in accordance with an embodiment of the present invention.

Referring now to FIG. 3, a graph illustrating the current ($I_{OUT}$) of the output signal OUT_SIG and a voltage level ($V_{SENSED\_I}$) of the sensed current signal SENSED_I across the fourth resistor 126 versus the drain-to-source voltage ($V_{DS\_FIRST}$) of the first transistor 108 in accordance with an embodiment of the present invention is shown. A method to determine values of the first and second control signals CTRL1 and CTRL2 is explained using the graph of FIG. 3. The external circuit determines the input signal IN_SIG that is provided to the drain of the first transistor 108 and the drain of the second transistor 112. The voltage level of the input signal IN_SIG is equal to a voltage level at the drain of each of the first and second transistors 108 and 112. The voltage level of the input signal IN_SIG is varied to vary the drain-to-source voltages ($V_{DS\_FIRST}$ and $V_{DS\_SECOND}$) of the first and second transistors 108 and 112.

In one embodiment, the voltage level of the input signal IN_SIG at the drain of the first transistor 108 is determined to be equal to a first drain-to-source voltage (shown as '$V_{DS1}$' in the graph of FIG. 3) of the first transistor 108. The first drain-to-source voltage ($V_{DS1}$) is greater than a difference between a corresponding gate-to-source voltage and a threshold voltage ($V_{TH}$) of each of the first and second transistors 108 and 112. It is understood by a person skilled in the art that the threshold voltage ($V_{TH}$) of each of the first and second transistors 108 and 112 is the minimum gate-to-source voltage required for each of the first and second transistors 108 and 112 to operate in the linear region or saturation region. Further, when the first drain-to-source voltage ($V_{DS1}$) is greater than the difference between the corresponding gate-to-source voltage and the threshold voltage ($V_{TH}$) of each of the first and second transistors 108 and 112, the first and second transistors 108 and 112 are in the saturation region. The external circuit determines a value of the first desirable current ($I_{SET}$) that is required to be generated by the first and second transistors 108 and 112. The value of the first desirable current ($I_{SET}$) is determined such that it is than the threshold current. Further, the value of the first desirable current ($I_{SET}$) is such that a voltage drop across the second resistive network 126 due to the first desirable current ($I_{SET}$) is less than the voltage level ($V_{REF}$) of the reference voltage signal REF. It is well-known to a person skilled in the art that, when each of the first and second transistors 108 and 112 operate in the saturation region, the value of the first desirable current ($I_{SET}$) depends on the gate-to-source voltage of the corresponding transistor.

When the resistance of the first resistive network 114 is less than the resistance of the first resistor 110, the voltage drop across the first resistor 110 is greater than the voltage drop across the first resistive network 114. Hence, a voltage level at the source of the first transistor 108 is greater than a voltage level at the source of the second transistor 112. The bias signal BIAS is received at the gates of the first and second transistors 108 and 112. Hence, the gate-to-source voltage ($V_{GS\_FIRST}$) of the first transistor 108 is less than the gate-to-source voltage ($V_{GS\_SECOND}$) of the second transistor 112. Hence, the current ($I_{OUT}$) of the output signal OUT_SIG is less than the current ($I_{SENSE}$) of the sensed current signal SENSED_I. Thus, when the current ($I_{SENSE}$) of the sensed current signal SENSED_I is equal to the first desired current ($I_{SET}$), the current ($I_{OUT}$) of the output signal OUT_SIG (shown as '$I_{LO}$' in the graph of FIG. 3) is less than the first desired current ($I_{SET}$).

The external circuit provides the second control signal CTRL2 to increase the resistance of the second resistive network 126, thereby increasing the voltage level ($V_{SENSED\_I}$) of the sensed current signal SENSED_I. This in turn leads to an increase in the voltage level of the bias signal BIAS and the gate-to-source voltage ($V_{GS\_FIRST}$), thereby increasing the current ($I_{OUT}$) of the output signal OUT_SIG. The resistance of the second resistive network 126 is increased by continuously modifying the second control signal CTRL2 until the current ($I_{OUT}$) of the output signal OUT_SIG is equal to the desirable current ($I_{SET}$). Thus, when the current ($I_{OUT}$) of the output signal OUT_SIG is equal to the desirable current ($I_{SET}$), the corresponding second control signal CTRL2 is stored in a register (not shown).

The external circuit provides the input signal IN_SIG such that the drain-to-source voltage ($V_{DS\_FIRST}$) of the first transistor 108 is equal to a second drain-to-source voltage (shown as $V_{DS2}$ in the graph of FIG. 3). The second drain-to-source voltage ($V_{DS2}$) is less than a difference between a corresponding gate-to-source voltage and the threshold voltage ($V_{TH}$) of the first transistor 108. It is known to a person skilled in the art that when the drain-to-source voltage ($V_{DS2}$) of each of the first and second transistors 108 and 112 is less than a difference between a corresponding gate-to-source voltage and the threshold voltage ($V_{TH}$) of the first transistor 108, each of the first and second transistors 108 and 112 operates in the linear region. Further, the external circuit determines a second desirable current ($I_{SET}/2$), which is half of the value of the first desirable current ($I_{SET}$). It is well known to a person skilled in the art that, when each of the first and second transistors 108 and 112 operate in the linear region, the second desirable current ($I_{SET}/2$) depends on the drain-to-source voltage and the gate-to-source voltage of the corresponding transistor. The drain-to-source voltage ($V_{DS\_FIRST}$) of the first transistor 108 is also less than the drain-to-source voltage ($V_{DS\_SECOND}$) of the second transistor 112. Hence, the current ($I_{OUT}$) of the output signal OUT_SIG is less than the current ($I_{SENSE}$) of the sensed current signal SENSED_I. Hence, when the current ($I_{OUT}$) of the output signal OUT_SIG is equal to the second desired current ($I_{SET}/2$), the current ($I_{SENSE}$) of the sensed current signal SENSED_I is greater than the second desired current ($I_{SET}/2$). Thus, the voltage level (shown as '$V_{LO}$' in the graph of FIG. 3) of the sensed current signal SENSED_I is greater than half of the voltage level corresponding to the reference voltage signal ($V_{REF}/2$).

The first control signal CTRL1 is provided by the external circuit to increase the resistance of the first resistive network 114, thereby decreasing the voltage level of the sensed current signal SENSED_I. The resistance of the first resistive network 114 is increased by modifying the first control signal CTRL1 until the voltage level of the sensed current signal SENSED_I is equal to half of the voltage level corresponding to the reference voltage signal ($V_{REF}/2$). Thus, when the voltage level of the sensed current signal SENSED_I is equal to half of the voltage level corresponding to the reference voltage signal ($V_{REF}/2$), the corresponding first control signal CTRL1 is stored in the register.

Similarly, when the resistance of the first resistive network 114 is greater than the resistance of the first resistor 110, the voltage drop across the first resistor 110 is less than the voltage drop across the first resistive network 114. Hence, the current ($I_{OUT}$) of the output signal OUT_SIG (shown as '$I_{HI}$' in the graph of FIG. 3) is greater than the first desired current (I=). Further, the voltage level (shown as '$V_{HI}$' in the graph of FIG. 3) of the sensed current signal SENSED_I is less than half of the voltage level corresponding to the reference voltage signal ($V_{REF}/2$). Hence, the second control signal CTRL2 is modified to decrease the resistance of the fourth resistor 126 until the current ($I_{OUT}$) of the output signal OUT_SIG is equal to the desirable current ($I_{SET}$) when the first transistor 108 is in the saturation region. Further, the first control signal CTRL1 is modified to decrease the resistance of the first resistive network 114 until the voltage level of the sensed current signal SENSED_I is equal to half of the voltage level corresponding to the reference voltage signal ($V_{REF}/2$).

The current-sense circuit 104 includes the multiplexer circuit 116 that selects at least one resistor of the set of resistors of the first resistive network 114. Thus, the multiplexer circuit 116 is programmable and modifies the resistance of the first resistive network 114. When the resistance of the first resistor 110 is less than the resistance of the first resistive network 114, the resistance of the first resistive network 114 can be decreased using the first control signal CTRL1 by way of the multiplexer circuit 116. Thus, the current clamp circuit 100 prevents an over-shoot in the current (shown as '$I_{OVER}$' in the graph of FIG. 3) of the output signal OUT_SIG when the drain-to-source voltage ($V_{DS\_FIRST}$) of the first transistor 108 is equal to a third drain-to-source voltage ($V_{DS3}$) (shown as '$V_{DS3}$' in the graph of FIG. 3), thereby preventing damage to the load circuit. Further, when the resistance of the first resistor 110 is greater than the resistance of the first resistive network 114, the resistance of the first resistive network 114 can be increased using the first control signal CTRL1 by way of the multiplexer circuit 116. Thus, the current clamp circuit 100 prevents an under-shoot in the current (shown as '$I_{UNDER}$' in the graph of FIG. 3) of the output signal OUT_SIG when the drain-to-source voltage ($V_{DS\_FIRST}$) of the first transistor 108 is equal to a third drain-to-source voltage ($V_{DS3}$), thereby increasing the efficiency of the current-source circuit 102.

Further, the resistance of the second resistive network 126 can be modified using the second control signal CTRL2 by way of the control circuit 124 to increase the accuracy of the sensed current signal SENSED_I. Thus, the resistances of the first and second resistive networks 114 and 128 are programmed using the first and second control signals CTRL1 and CTRL2, respectively, to account for the parasitic resistances of the first and second transistors 108 and 112 without measuring the resistances of the first resistor 110 and the first resistive network 114.

Moreover, the first transistor 108, the second transistor 112, and the first resistive network 114 are fabricated in an IC such that they are adjacent to each other. This prevents introduction of unequal variations in the resistances of the first resistor 110 and the first resistive network 114 due to the package stress and PVT variations. Thus, the current-sense circuit 104 accurately senses the current ($I_{OUT}$) of the output signal OUT_SIG irrespective of the resistance of the first resistor 110, which is a parasitic resistor of the first transistor 108 and irrespective of the process-voltage-temperature (PVT) variations in the first resistor 110.

In the claims, the words 'comprising', 'including' and 'having' do not exclude the presence of other elements or steps then those listed in a claim. The terms "a" or "an," as used herein, are defined as one or more than one. Unless stated otherwise, terms such as "first" and "second" are used to arbitrarily distinguish between the elements such terms describe. Thus, these terms are not necessarily intended to indicate temporal or other prioritization of such elements.

The fact that certain measures are recited in mutually different claims does not indicate that a combination of these measures cannot be used to advantage.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A current clamp circuit, comprising:
a current-source circuit that receives an input signal and a bias signal and outputs an output signal, wherein a current of the output signal is controlled by the bias signal;
a current-sense circuit, connected to the current-source circuit, that receives the input and output signals, a first control signal, and the bias signal, and outputs a sensed current signal based on the first control signal and the bias signal, wherein a current of the sensed current signal is equal to the current of the output signal; and
a feedback circuit, connected to the current-sense circuit, that receives the sensed current signal, a second control signal, and a reference voltage signal, and outputs the bias signal based on the second control signal, the reference voltage signal, and the sensed current signal,
wherein the current-sense circuit comprises:
a first transistor having a drain that receives the input signal, a gate that receives the bias signal, and a source that provides an intermediate signal, wherein a current of the intermediate signal is equal to the current of the sensed current signal;
a resistive network, connected to the source of the first transistor, wherein the resistive network includes a set of series connected resistors, the intermediate signal is input to the resistive network, and the sensed current signal is output from the resistive network;
a multiplexer circuit, connected to the resistive network and the first transistor, wherein the multiplexer receives the first control signal and the intermediate signal, modifies a resistance of the resistive network based on the first control signal, and outputs a sensed voltage signal based on the modified resistance of the resistive network and the intermediate signal, and wherein the first control signal includes a set of bits corresponding to the set of resistors of the resistive network; and
an operational amplifier having first and second input terminals connected to the current-source circuit and the multiplexer circuit for receiving the output signal and the sensed voltage signal, respectively, and an output terminal connected to the resistive network,
wherein when the first transistor operates in a linear region, the multiplexer circuit modifies the resistance of the resistive network based on the first control signal.

2. The current clamp circuit of claim 1, wherein the current-source circuit comprises:
a second transistor having a drain that receives the input signal, a gate that receives the bias signal, and a source that outputs the output signal at an intermediate voltage level; and
a first resistor, connected to the source of the first transistor, that receives the output signal, and outputs the output signal at an output voltage level.

3. The current clamp circuit of claim 1, wherein the current-sense circuit includes a second transistor having a source connected to the resistive network, a gate connected to the output terminal of the operational amplifier, and a drain that outputs the sensed current signal to the feedback circuit.

4. The current clamp circuit of claim 1, wherein the multiplexer circuit includes a set of switching circuits that corresponds to the set of resistors and to the set of bits of the first control signal, wherein each switching circuit of the set of switching circuits comprises:
a second transistor having a source connected to a corresponding resistor of the set of resistors, a gate that receives a corresponding bit of the first control signal, and a drain connected to a node;
a third transistor having a source connected to an output terminal of the multiplexer circuit for providing the sensed voltage signal, a gate that receives the corresponding bit of the first control signal, and a drain connected to the node;
a fourth transistor having a drain connected to the node, a gate that receives an inverted version of the corresponding bit of the first control signal, and a source connected to ground; and
a capacitor connected between the drain and the source of the fourth transistor.

5. The current clamp circuit of claim 1, wherein the feedback circuit includes:
a second resistive network having a first terminal connected to the current-sense circuit for receiving the sensed current signal and a second terminal connected to ground;
a control circuit, connected to a third terminal of the resistive network, wherein the control circuit receives the second control signal and modifies a resistance of the second resistive network based on the second control signal; and
an operational amplifier having a first input terminal connected to the first terminal of the resistive network, a second input terminal that receives the reference voltage signal, and an output terminal that outputs the bias signal.

6. The current clamp circuit of claim 5, wherein when the first transistor operates in a saturation region, and the control circuit modifies the resistance of the resistive network based on the second control signal.

7. A current clamp circuit, comprising:
a current-source circuit for receiving an input signal and a bias signal and outputting an output signal having a current that is controlled by the bias signal;
a current-sense circuit, connected to the current-source circuit, that receives the input and output signals, a first control signal, and the bias signal, and outputs a sensed current signal based on the first control signal and the bias signal, wherein a current of the sensed current signal is equal to the current of the output signal, and wherein the current-sense circuit comprises:
a first transistor having a drain that receives the input signal, a gate that receives the bias signal, and a source that provides an intermediate signal, wherein a current of the intermediate signal is equal to the current of the sensed current signal;
a first resistive network, connected to the source of the first transistor, wherein the first resistive network includes a set of series connected resistors that receives the intermediate signal, and outputs the sensed current signal;

a multiplexer circuit, connected to the first resistive network, that receives the first control signal and the intermediate signal, modifies a resistance of the first resistive network based on the first control signal, and outputs a sensed voltage signal based on the modified resistance of the first resistive network and the intermediate signal, wherein the first control signal includes a set of bits corresponding to the set of resistors of the first resistive network; and a first operational amplifier having first and second input terminals connected to the current-source circuit and the multiplexer circuit for receiving the output signal and the sensed voltage signal, respectively, and an output terminal connected to the first resistive network; and a feedback circuit, connected to the output terminal of the first operational amplifier, wherein the feedback circuit receives the sensed current signal, a second control signal, and a reference voltage signal and outputs the bias signal based on the second control signal, the reference voltage signal, and the sensed current signal, wherein the feedback circuit includes:

a second resistive network having a first terminal connected to the current-sense circuit for receiving the sensed current signal and a second terminal connected to ground;

a control circuit, connected to a third terminal of the resistive network, that receives the second control signal and modifies a resistance of the resistive network based on the second control signal; and a second operational amplifier having a first input terminal connected to the first terminal of the second resistive network, a second input terminal for receiving the reference voltage signal, and an output terminal for outputting the bias signal, wherein when the first transistor operates in a saturation region, the control circuit modifies the resistance of the second resistive network based on the second control signal.

8. The current clamp circuit of claim 7, wherein the current-source circuit includes:

a second transistor having a drain that receives the input signal, a gate that receives the bias signal, and a source that provides the output signal at an intermediate voltage level; and a first resistor having a first terminal connected to the source of the second transistor for receiving the output signal and a second terminal for outputting the output signal at an output voltage level.

9. The current clamp circuit of claim 7, wherein the current-sense circuit includes a second transistor having a source connected to the first resistive network, a gate connected to the output terminal of the first operational amplifier, and a drain that provides the sensed current signal.

10. The current clamp circuit of claim 7, wherein the multiplexer circuit includes a set of switching circuits that corresponds to the set of resistors and to the set of bits of the first control signal, wherein each switching circuit of the set of switching circuits includes:

a second transistor having a source connected to a corresponding resistor of the set of resistors, a gate for receiving a corresponding bit of the first control signal, and a drain connected to a node;

a third transistor having a source connected to an output terminal of the multiplexer circuit for providing the sensed voltage signal, a gate for receiving the corresponding bit of the first control signal, and a drain connected to the node;

a fourth transistor having a drain connected to the node, a gate for receiving an inverted version of the corresponding bit of the first control signal, and a source connected to ground; and a capacitor connected between the drain and source of the fourth transistor.

11. The current clamp circuit of claim 7, wherein when the first transistor operates in a linear region, the multiplexer circuit modifies the resistance of the first resistive network based on the first control signal.

* * * * *